(12) United States Patent
Thigle et al.

(10) Patent No.: US 12,306,216 B2
(45) Date of Patent: May 20, 2025

(54) DYNAMIC VOLTAGE REGULATOR SENSING FOR CHIPLET-BASED DESIGNS

(71) Applicant: Intel Corporation, Santa Clara, CA (US)

(72) Inventors: Vikrant Thigle, Bangalore (IN); Vijay Anand Mathiyalagan, Austin, TX (US); Anand Haridass, Karnataka (IN); Arun Chandrasekhar, Bangalore (IN); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 18/076,352

(22) Filed: Dec. 6, 2022

(65) Prior Publication Data

US 2024/0183884 A1 Jun. 6, 2024

(51) Int. Cl.
*G01R 19/25* (2006.01)
*G01R 19/00* (2006.01)
*G05F 1/46* (2006.01)

(52) U.S. Cl.
CPC ......... *G01R 19/0038* (2013.01); *G01R 19/25* (2013.01); *G05F 1/46* (2013.01)

(58) Field of Classification Search
CPC  G01R 19/25; G01R 19/2503; G01R 19/2509; G01R 19/2513; G05F 1/10; G05F 1/46; G06F 1/00; G06F 1/26

USPC .................................................. 327/530, 540
See application file for complete search history.

(56) References Cited

U.S. PATENT DOCUMENTS

| | | | | |
|---|---|---|---|---|
| 6,031,362 A | * | 2/2000 | Bradley | H02M 3/33561 |
| | | | | 323/267 |
| 10,955,885 B2 | * | 3/2021 | Zelikson | H03K 17/687 |

* cited by examiner

*Primary Examiner* — Hai L Nguyen
(74) *Attorney, Agent, or Firm* — NICHOLSON DE VOS WEBSTER & ELLIOTT LLP

(57) ABSTRACT

Embodiments herein relate to a chiplet or other die which includes multiple sense points within the die and components for digitizing and outputting sensed voltages of the sense points. In one approach, an analog-to-digital converter (ADC) is coupled to each sense point, and a multiplexer is coupled to the outputs of the ADCs. A select signal for the multiplexer can be received from an external control unit which selects one of the sense points based on information such as a current workflow of the die. The selected sense point can change as the workflow changes. The optimal sense point can be determined by comparing the voltage of each sense point and selecting the sense point with the lowest voltage. The sensed voltage is provided to a voltage regulator as a feedback signal to optimize control of the power supply of the die.

19 Claims, 9 Drawing Sheets

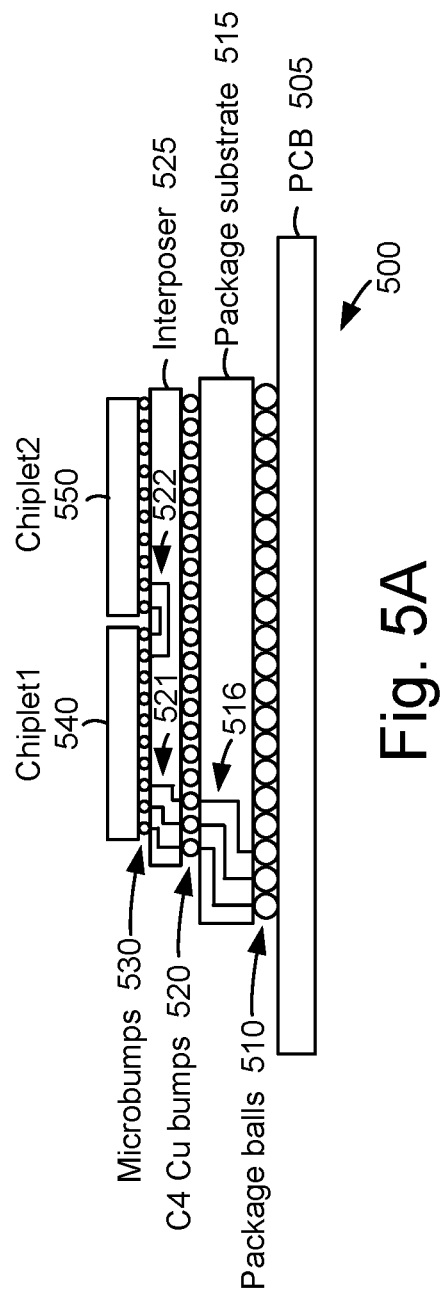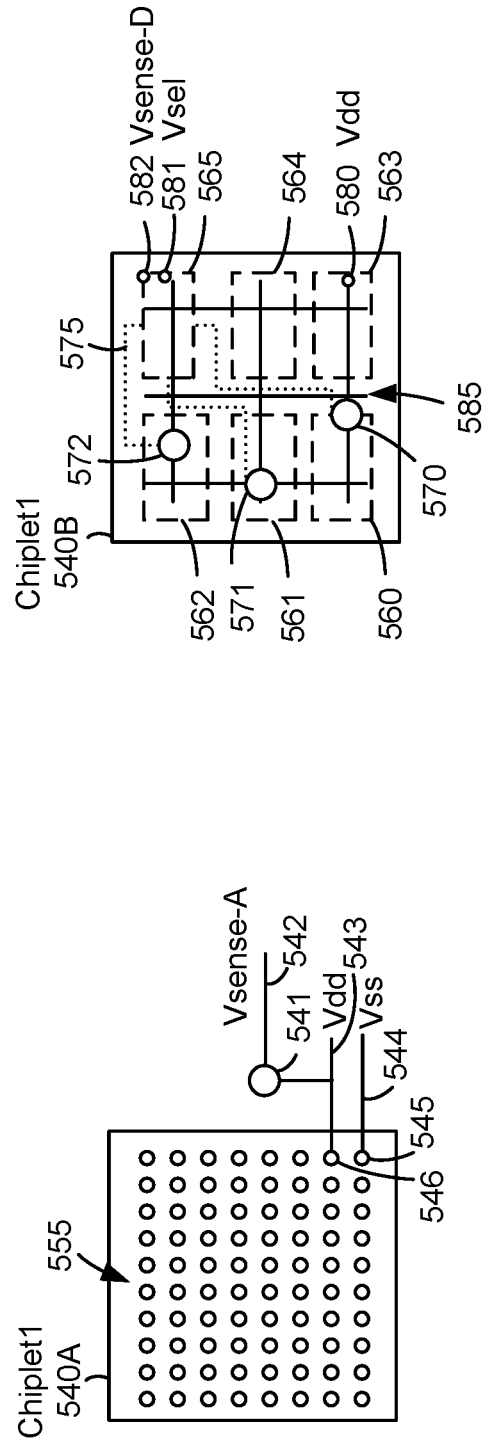

| Workload | Sense point | Sensed voltage |
|---|---|---|
| WL1 | SP1 | V1-WL1 |
| WL1 | SP2 | V2-WL1 | ← Select
| WL1 | SP3 | V3-WL1 |
| WL2 | SP1 | V1-WL2 |
| WL2 | SP2 | V2-WL2 |
| WL2 | SP3 | V3-WL2 | ← Select

Fig. 7C

| Workload | Sense point |
|---|---|
| WL1 | SP2 |
| WL2 | SP3 |

Fig. 7D

Received digitized voltages from a die 720
↓
Store the digitized voltages in a buffer 721
↓
Perform an analysis on the digitized voltages 722
↓
Provide a digital signal which represents the digitized voltages to the voltage regulator as a feedback signal 723

Fig. 7E

DYNAMIC VOLTAGE REGULATOR SENSING FOR CHIPLET-BASED DESIGNS

FIELD

The present application generally relates to the field of computing devices and more particularly to voltage regulator (VR) which supplies power to a die.

BACKGROUND

A VR is used in a computing system to supply power to the circuits of the system. A VR can provide power at different voltages such as 3.3 V, 5 V and 12 V, for use by various components in the computing system. A feedback path of the VR can provide a sensed voltage of a load which is being powered, where the VR uses the sensed voltage to adjust its output. However, various challenges are presented in optimizing the output of a VR.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A depicts a side view of an example implementation of a semiconductor package 500 which includes two chiplets 540 and 550 as example loads, consistent with the circuits of FIG. 2A-4, according to various embodiments.

FIG. 5B depicts a bottom view of a chiplet 540A corresponding to the chiplet 540 of FIG. 5A, showing an example arrangement of micro bumps 555 and an external analog voltage sense point 541, consistent with the circuit of FIG. 1, according to various embodiments.

FIG. 5C depicts a top view of a chiplet 540B corresponding to the chiplet 540 of FIG. 5A, showing an example arrangement of circuits 560-565, and sense points 570-572, where the circuit 565 includes ADCs and a multiplexer such as depicted in FIG. 3 or 4, according to various embodiments.

FIG. 7C depicts an example data structure consistent with step 702 of the process of FIG. 7A, according to various embodiments.

FIG. 7D depicts an example data structure consistent with step 704 of the process of FIG. 7B, and with FIG. 7C, according to various embodiments.

FIG. 7E depicts a flowchart of an example process for analyzing digitized voltages from a die before providing a digital signal which represents the digitized voltages to a voltage regulator as a feedback signal, consistent with the circuit 250 of FIG. 2B, according to various embodiments.

DETAILED DESCRIPTION

Figure 1:
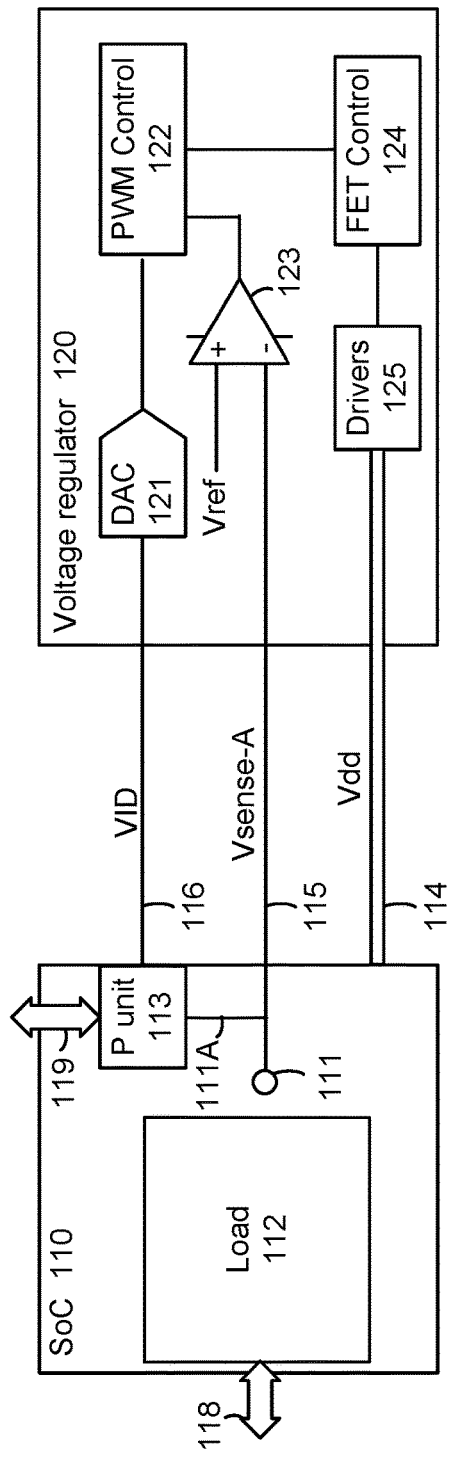
FIG. 1 depicts a block diagram of a circuit 100 in which a voltage regulator (VR) 120 powers a load 112 on a system on a chip (SoC) 110, where a sense point 111 for the VR is external to the load 112, according to various embodiments.

As mentioned at the outset, various challenges are presented in optimizing the output of a voltage regulator (VR). In particular, a sensed voltage is used as a feedback signal for a control loop of the VR. For example, when the VR provides power to a die on a package, the sense point may be placed on the package close to die bumps, e.g., conductive micro bumps which are used to attach the die to the package. In one example scenario, the die is a chiplet mounted in a system on a chip (SoC)

However, this approach has various disadvantages. For example, since the sense point is external to the die, it may not accurately reflect the voltage within the die. Moreover, the sense point on the package is static and cannot be changed dynamically. The sense point cannot be placed at the most optimal location on the package and is statically determined, e.g., based on simulations. This approach does not address process/workload variations that a typical chiplet on a SoC architecture might see. Further, due to practical limitations, there is only one sense point for feedback over a large area and this leads to a large gradient, e.g., the difference in voltage between the sense point and other locations in the die. Additionally, analog remote VR sense signals are sensitive to noise and need to follow special routing guidelines on the platform. Finally, it is challenging to multiplex the analog remote sense signals.

A solution provided herein addresses the above and other issues. In one aspect, the solution involves providing one or more sense points within (internal to) a die, and an analog-to-digital converter (ADC) to digitize the sensed voltages before they are output as a feedback signal to a VR. In another aspect, a multiplexer (mux) is provided within the die to select one of the digitized voltages for output. The selection can be based on factors such as the current workload of the die. This provides the capability to dynamically adjust the choice of the sense point to an appropriate location based on a configuration and workloads. An output of the multiplexer can be adjusted based on a control signal from a control unit which is external to the die.

Dynamically changing the sense point can lead to performance benefits. For example, a dynamic sense point could cover a wider process and workload variance and could benefit different types of dies including chiplet-based designs which include multiple chiplets on a package which are power by a common VR. In some cases, multiple stacked chiplets are provided using packaging technologies including 2.5D and 3D stacking The sense point in each chiplet can be adjusted based on the workload running on the respective chiplet.

The sense points can be placed closer to the load, on the die, to more accurately represent the load voltage. This enables a lower guard band during binning because the sense point is closer to load. That is, the feedback voltage to the VR is more accurate so that a guard band can be reduced. The sense points can be placed in different locations within different die. In some cases, the digitized outputs from different die can be multiplexed to provide a single feedback signal to a VR which power the different die.

Moreover, digitizing the voltage values has various benefits including reduced sensitivity to noise/crosstalk. This translates to resource savings on the package and board.

The solution is compatible with various types of die, including SoCs using a chiplet based architecture. Instead of having the chiplet share a common VR sense location (which is static and determined a priori), which leads to a suboptimal PNP, the solutions provided herein can include dynamically choosing a sense point within a die or other load based on loading conditions and process variations. Moreover, to facilitate the implementation and improve reliability, the solution can include digitizing the remote VR sense signal on the SoC.

The above and other advantages will be further apparent in view of the following discussion.

FIG. 1 depicts a block diagram of a circuit 100 in which a voltage regulator (VR) 120 powers a load 112 on a system on a chip (SoC) 110, where a sense point 111 for the VR is external to the load 112, according to various embodiments. The VR and SoC could be provided on a common mother board of a computing device, in one approach. The VR includes a digital-to-analog converter (DAC) 121 which receives a voltage identification definition (VID) signal from a control unit 113, referred to as a P unit, on a path 116. The VID is a code which sets a target voltage output or set point of the VR. The VID is converted to an analog signal for use by a pulse width modulation (PWM) control (controller) 122, which controls a duty cycle of the VR. The PWM control is also responsive to an output of a comparator 123, which compares a reference voltage Vref at a non-inverting input to a feedback sense voltage, Vsense-A, at an inverting input on a path 115. Vsense-A is an analog signal representation of a voltage sensed at a sense point 111 on the SoC. The PWM control 122 provides an output to a field effect transistor (FET) control 124, which in turn controls drivers 125. The drivers can include high-side and low-side transistors, for example, which provide an output voltage Vdd on a path 114.

The SoC includes a load 112, which may be a die such as a chiplet, in one possible implementation. This is a load which receives power from the VR on the path 114. This example includes one chiplet on the SoC but more than one chiplet or other die can be provided as well on the SoC or other package.

The P unit may be a control unit, e.g., processor, on the SoC which communicates on a path 119 with a higher-level control such as to receive identifiers of workloads, e.g., tasks to be performed by the load. The load 112 may also communicate with the higher-level control via a path 118 to receive the workloads themselves and communicate results of performing the workloads back to the higher-level control. Examples of workloads include providing a weather forecast for a weather forecasting service or retrieving map data for a user's mobile device in a map application. The workload can include, e.g., data and instructions for operating on the data. The P unit may optionally receive Vsense-A via a path 11A which is coupled to the path 115, for use in adjusting thr VID.

The sense point 111 may be located on the package top layer, for example. This analog sense point is chosen by pre-silicon simulations and ensures uncompromised power delivery. The sense point is then routed to a package pin of the SoC. From the package pin, the sense line is routed to the VR controller, e.g., on the path 115. At the comparator, the analog sensed voltage is compared to a fixed Vref and the output is connected to the PWM control 122. The PWM control also receives the analog form of the VID input. VID is digital signal which is converted to analog and fed to the PWM control. Based on the VID and output of the comparator 123, the PWM control drives a PWM signal to the drivers via the FET control to adjust the output voltage, Vdd. However, as mentioned, this approach has various challenges. For example, analog remote VR sense signals are sensitive to noise, resulting in the need to follow special routing guidelines on the platform. Additionally, the sense points cannot be placed at the most optimal location on the package. Finally, it is complex to multiplex analog remote sense signals.

Figure 2A:
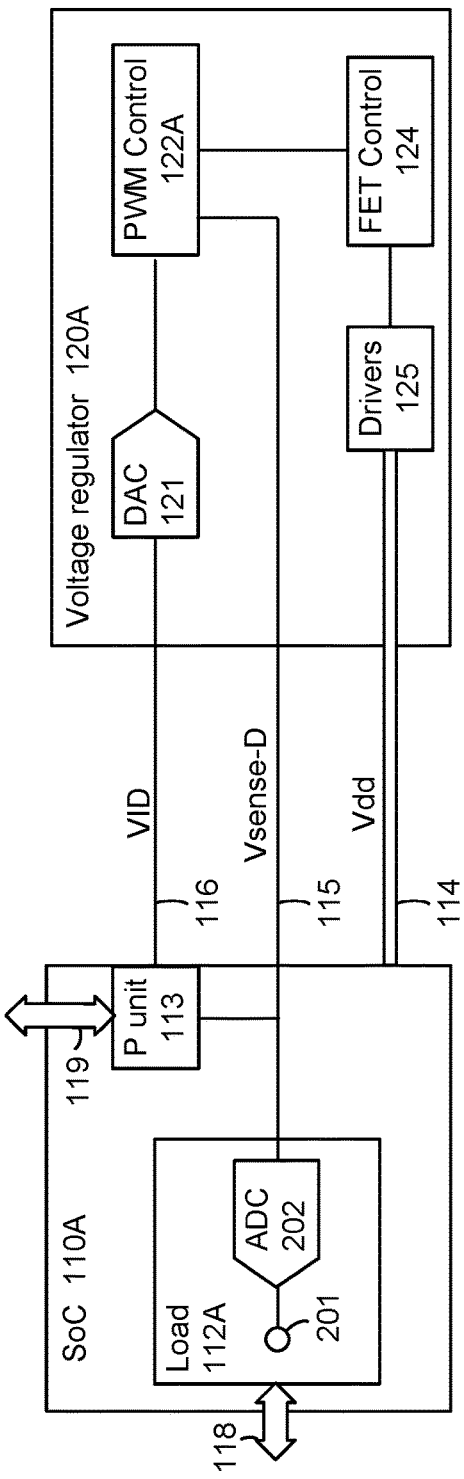
FIG. 2A depicts a block diagram of a circuit 200 in which a VR 120A powers a load 112A on a SoC 110A, where a sense point 201 for the VR, and an analog-to-digital converter (ADC) 202 to digitize the sensed voltage, are within the load 112A, according to various embodiments.

FIG. 2A depicts a block diagram of a circuit 200 in which a VR 120A powers a load 112A on a SoC 110A, where a sense point 201 for the VR, and an analog-to-digital converter (ADC) 202 to digitize the sensed voltage, are within the load 112A, according to various embodiments. To overcome the challenges of the circuit of FIG. 1, the circuit 200 avoids routing an analog feedback signal from the load (SoC, etc.) to the VR. Instead, the SoC implements a sense point 201 on the load 112A (e.g., die), the die converts an analog voltage at the sense point to a digital signal using an ADC 202 on the die, and this digital signal is routed to the VR at the PWM control. The PWM control also receives the VID, and adjusts the PWM duty cycle as appropriate to provide the output voltage at the desired target level. Based on the PWM frequency/duty cycle, the output voltage Vdd of the VR is modulated.

Example implementation details for the ADC 202 are as follows. Regarding a sampling rate/resolution, assuming a switching frequency of 1 MHz at the VR, an example sampling rate requirement is >2 Msps (mega samples per second) with a resolution of 12-bits. The sampling rate is determined by the Nyquist theorem (>2× of maximum frequency). Regarding a power rail for the ADC, the ADC can be powered by the VCCINF rail on the digital and analog side. VCCINF is the input voltage to the voltage regulator. This is the same the SVID power supply. This is to ensure that the ADC is up before ramping up the VCC rail. SVID refers to Serial Voltage Identification interface, which is a protocol for the CPU's power control unit to communicate with the PWM control. A sequence for the ADC is as follows: VCCINF ramp up→ADC functional→VCC ramp up. A clock source for the ADC can be a divided version of a clock from a crystal oscillator.

In addition to the advantages discussed previously, digitization can help compensate for an IR (current-resistance) drop on the path 115 which is routed from the package to the VR. The path carries a digital sense voltage, Vsense-D, which is output from the ADC 202 as a feedback signal for the VR.

Figure 2B:
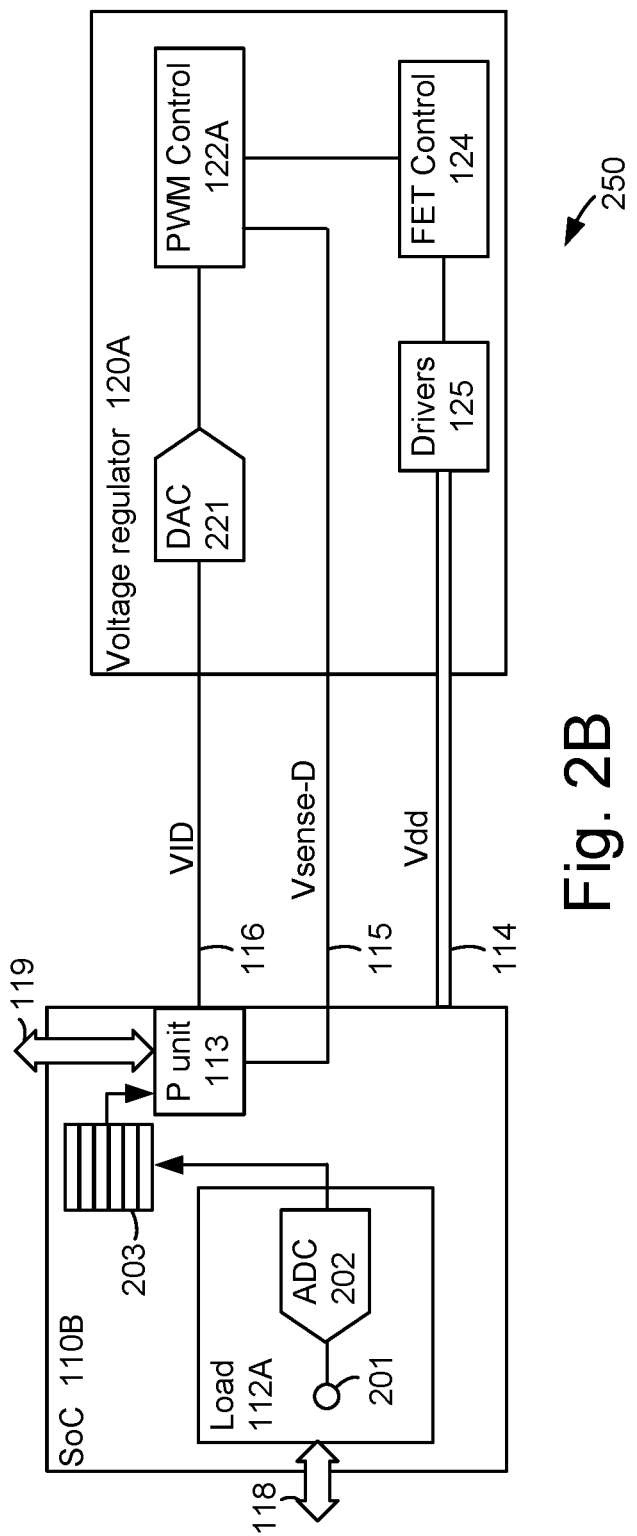
FIG. 2B depicts a block diagram of a circuit 250 in which a SoC 110B includes a buffer 203 for storing digitized voltages from the load 112A to enable the P unit 113 to perform analytics, according to various embodiments.

FIG. 2B depicts a block diagram of a circuit 250 in which a SoC 110B includes a buffer 203 for storing digitized voltages from the load 112A to enable the P unit 113 to perform analytics, according to various embodiments. In this example, the digitized voltages from the ADC 202 are stored in the buffer 203, which may be a first-in, first-out (FIFO) buffer. The P unit accesses the buffer to retrieve the digitized voltages and perform an analysis of the digitized voltages, e.g., obtain analytics regarding the voltage. One example is obtaining a moving average of the voltages over a time window. Another example is smoothing or other filtering of the voltages. Another example is storing maximum and/or minimum values of the voltages. The P unit can then, based on the analysis, transmit a digital signal which represents the digitized voltages to the voltage regulator as a feedback signal on the path 115. The P unit can essentially perform an enhanced telemetry on the voltage data.

Additionally, during a validation or testing phase of the die, the remote sense data could be monitored for different workloads and used to precisely adjust the output voltage of the VR.

The buffer can be separate from or part of the P unit, for example.

See also the flowchart of FIG. 7E.

Figure 3:
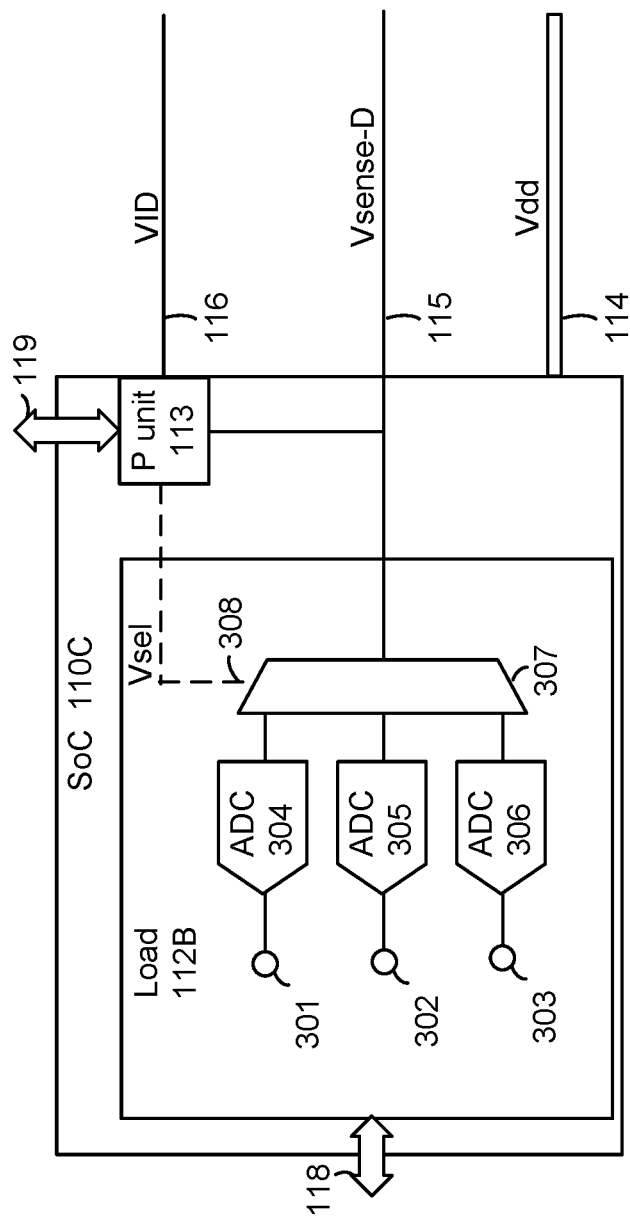
FIG. 3 depicts a block diagram of a SoC 110C where multiple sense points 301, 302 and 303, ADCs 304, 305 and 306, and a multiplexer 307, are within a load 112B, according to various embodiments.

FIG. 3 depicts a block diagram of a SoC 110C where multiple sense points 301, 302 and 303, ADCs 304, 305 and 306, and a multiplexer 307, are within a load 112B, according to various embodiments. For clarity, the VR is omitted but could be the same as the VR 120A of FIGS. 2A and 2B. This configuration provides multiple sense point on a die. These sense points can be chosen based on the configuration of the package or can be dynamically chosen based on the workload currently running, for instance. The multiplexer 307 chooses one of the different sense points on the die based on a control signal, Vsel, provided on a selection input 308 of the multiplexer. The digitized voltage of the selected sense point is then output on the path 115 as Vsense-D for use by the VR. Based on the configuration of the package or the workload, firmware in the P unit, for example, can choose the optimal sense point during boot or at run-time.

Figure 4:
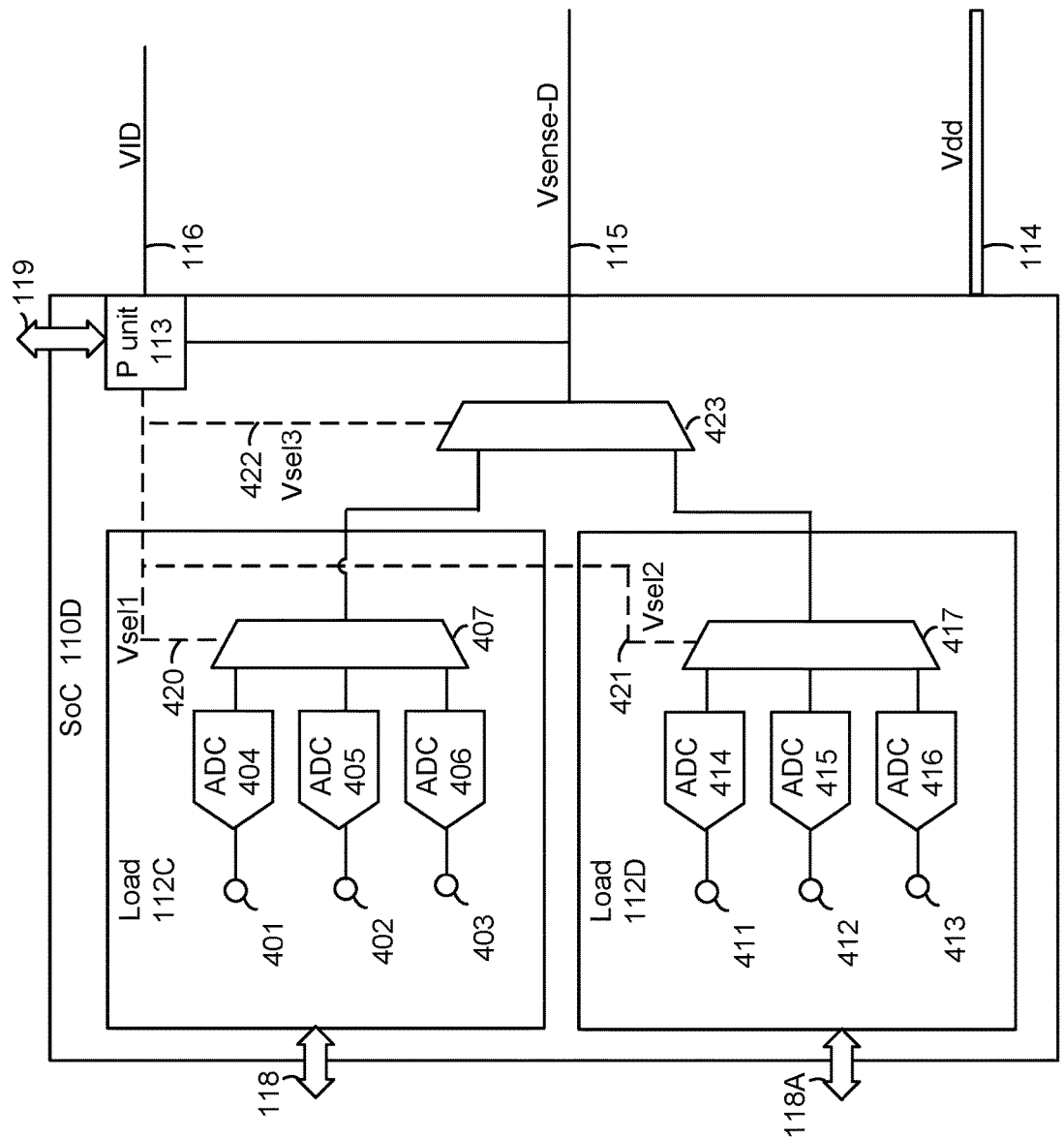
FIG. 4 depicts a block diagram of a SoC 110D where multiple sense points 401, 402 and 403, ADCs 404, 405 and 406, and a multiplexer 407, are within a first load 112C, multiple sense points 411, 412 and 413, ADCs 414, 415 and 416, and a multiplexer 417, are within a second load 112D, and a multiplexer 423 which is external to the loads 112C and 112D receives a digitized sense voltage from each of the multiplexers 407 and 417, according to various embodiments.

FIG. 4 depicts a block diagram of a SoC 110D where multiple sense points 401, 402 and 403, ADCs 404, 405 and 406, and a multiplexer 407, are within a first load 112C, multiple sense points 411, 412 and 413, ADCs 414, 415 and 416, and a multiplexer 417, are within a second load 112D, and a multiplexer 423 which is external to the loads 112C and 112D receives a digitized sense voltage from each of the multiplexers 407 and 417, according to various embodiments. The P unit provides select signals Vsel1, Vsel2 and Vsel3 on paths 420, 421 and 422, respectively, to selected an input signal for each of the multiplexers 407, 417 and 423, respectively.

The concept of FIG. 3 can be extended generally to multi-tile/multi-chiplet designs. Each tile or die may have multiple sense points routed to a multiplexer on the same tile, e.g., multiplexers 407 and 417. The outputs of all the tiles are routed to another multiplexer 423 on the base die or other base layer, external to the loads/tiles/dies. The output of this external multiplexer is then routed to the VR controller as Vsense-D. Depending on the configuration of the SoC and/or the workload running on the SoC, the sense point can be dynamically changed to optimize performances. In a heterogeneous chiplet architecture (combining different process technologies or compute engines on the same package each with its own frequency versus voltage (FV) curve or operating points), this approach can choose the optimal sense point.

In another aspect, the VR could poll more than one sense line and, depending on the sense voltage, adjust the VR output.

The load 112D may communicate with a higher-level control via a path 118A to receive workloads and communicate results of performing the workloads back to the higher-level control.

FIG. 5A depicts a side view of an example implementation of a semiconductor package 500 which includes two chiplets 540 and 550 as example loads, consistent with the circuits of FIG. 2A-4, according to various embodiments. Semiconductor die can be packaged in various ways. In this example approach, a printed circuit board (PCB) 505 is the bottom layer of the structure. A package substrate 515 is mounted to the PCB using package balls 510 which are conductive metal balls. An interposer 525 is mounted to the package substrate 515 using C4 copper (Cu) bumps 520. C4 refers to controlled collapse of chip connection, which is associated with the ball-grid array (BGA) packaging process. Finally, chiplets 540 and 550 are mounted to the interposer 525 using micro bumps 530, also referred to as simply bumps.

The balls and bumps are conductive contact points to carry signals and power from the PCB to the chiplets. These contact points are coupled to conductive paths in the layers. For example, the package substrate 515 includes example conductive paths 516 for carrying signals and/or power between the PCB and the interposer, and the interposer 525 includes example conductive paths 521 for carrying signals and/or power between the package substrate and the chiplets. The interposer also includes example conductive paths 522 for carrying signals and/or power between the chiplets. Except for the top layer of the structure, each ball or bump can be connected to a corresponding bump in a next higher layer, and each layer can be considered to be a base layer for one or more higher layers.

The micro bumps of the chiplets can be used to receive power from the VR and select signals from the P unit, and to output digitized sensed voltage data from the on-die ADCs and multiplexers such as depicted in FIG. 2A-4.

FIG. 5B depicts a bottom view of a chiplet 540A corresponding to the chiplet 540 of FIG. 5A, showing an example arrangement of micro bumps 555 and an external analog voltage sense point 541, consistent with the circuit of FIG. 1, according to various embodiments. The micro bumps can be arranged in a grid, for example. Here, a bump 546 is coupled to a path 543 which carries the voltage Vdd from the VR. The sense point 541 in turn is coupled to the path 543. A ground path 544 at a voltage Vss=0 V is also coupled to a bump 545 of the chiplet. As mentioned, this approach provides an analog sense point external to the chiplet and therefore has various disadvantages.

FIG. 5C depicts a top view of a chiplet 540B corresponding to the chiplet 540 of FIG. 5A, showing an example arrangement of circuits 560-565, and sense points 570-572, where the circuit 565 includes ADCs and a multiplexer such as depicted in FIG. 3 or 4, according to various embodiments. The chiplet can include the array of micro bumps 555 on its bottom side as in FIG. 5B. The circuits 560-564 are for performing functions such as processing workloads which are assigned to it by a higher-level control. These circuits may handle different types of different workloads and/or different aspects of a given workload.

The circuit 565 includes ADCs and a multiplexer such as depicted in FIG. 3 or 4. For example, the circuit 565 could include the ADCs 304-306 and the multiplexer 307 of FIG. 3. Conductive paths in the chiplet (such as path 575), represented by dotted lines, connect each sense point with a respective ADC in the circuit 565. The sense points can be points on a power distribution network 585 within the chiplet. This is a network of conductive paths which distribute the power from the VR to the different circuits in the chiplet. In one approach, the power distribution network is a power supply grid. A similar grid, not shown, can be provided as ground path in the chiplet, in one possible implementation. Since the sense points are very close to the circuits, they provide an accurate representation of the voltages within the chiplet and its circuits to allow the VR to precisely control the supplied power. The sense points can be positioned close to the circuits which are expected to consume the most power, in one approach, As mentioned, the bumps provide contacts to the base layer below for receiving power and control signals and for outputting digitized voltage data. For example, a bump 580 receives the power supply voltage, Vdd. Another example bump 581 receives the select signal, Vsel (see FIG. 3) from the P unit. Another example bump 582 outputs digitized voltage data as Vsense-D. The bump 580 is an example of first bump of a plurality of bumps which is coupled to the power distribution network 585 and is to receive the power from the voltage regulator. The bump 582 is an example of a second bump which is coupled to an output of the multiplexer. The second bump is to output digitized voltages of one or more ADCs to the voltage regulator. In some embodiments, the second bump is to output the digitized voltages of the one or more ADCs to a control unit external to the die, e.g., the P unit, and the control unit is to provide a voltage set point to the voltage regulator based on the digitized voltages.

The bump 581 is an example of a third bump which is coupled to a selection input of the multiplexer and to a control unit external to the die to receive a control signal to control the multiplexer.

Figure 6:
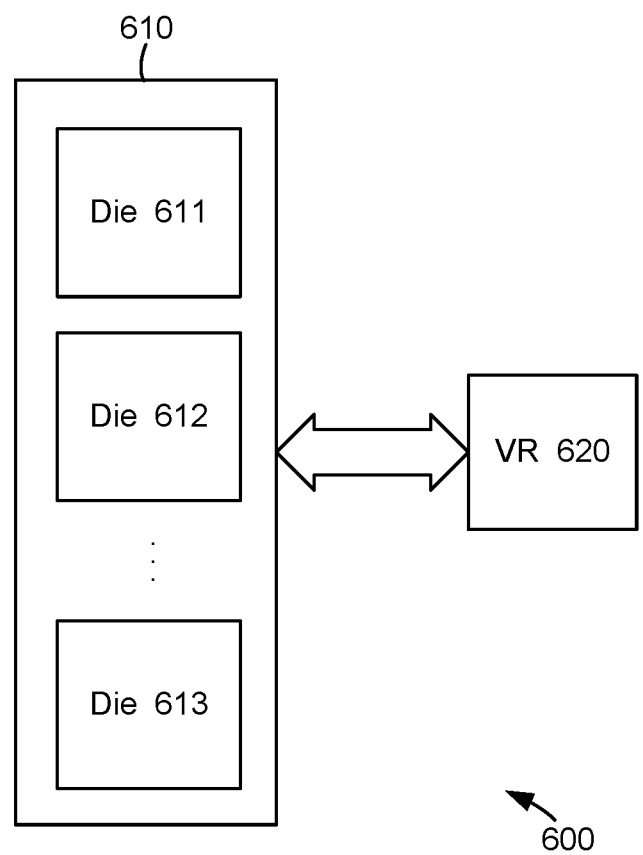
FIG. 6 depicts a block diagram of a computing system 600 which includes a plurality of dies 611, 612, . . . , 613 in a package 610, where the dies are powered by a common VR 620, according to various embodiments.

FIG. 6 depicts a block diagram of a computing system 600 which includes a plurality of dies 611, 612, . . . , 613 in a package 610, where the dies are powered by a common VR 620, according to various embodiments. The package thus includes a multi-die system with multiple dies coupled to a common VR. Various embodiments herein can include a multi-die system (MDS). The MDS may include multiple dies coupled to a common base die (e.g., interposer) and/or otherwise integrated into a same package. The dies may include heterogeneous dies of different types and/or capabilities. Additionally, or alternatively, the dies may include multiple similar/same dies. For example, the dies may include one or more processor dies, memory dies, graphics processor dies, input-output (IO) dies, voltage regulator (VR) dies, power management dies, and/or other suitable types of die.

Figure 7A:
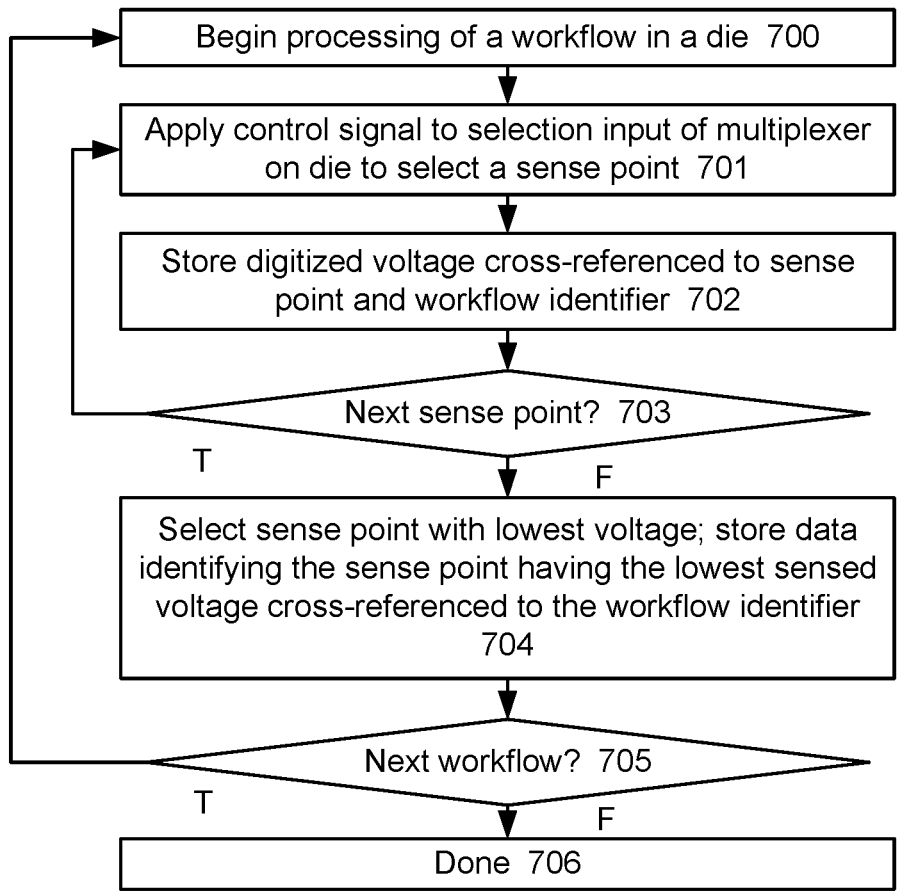
FIG. 7A depicts a flowchart of an example process for identifying an optimal sense point in a die based on a workflow in a testing phase of the die, according to various embodiments.

FIG. 7A depicts a flowchart of an example process for identifying an optimal sense point in a die based on a workflow in a testing phase of the die, according to various embodiments. The process assumes multiple sense points are available in the die. A testing phase can be performed before the die is used in its operational mode. In one approach, the testing phase is performed before the die is released to the user, and the selected sense points can be used subsequently over the lifetime of the die. In another approach, the testing phase is performed periodically during the lifetime of the die, such as each time the die is powered up, during the boot process of the associated computing device.

Step 700 begins processing of a workflow in a die. Step 701 includes applying a control signal (e.g., Vsel, Vsel1, Vsel2) to a selection input of a multiplexer on the die to select a sense point. Step 702 includes storing a digitized voltage of the sense point cross-referenced to the sense point and to a workflow identifier. For example, see FIG. 7C. A decision step 703 determines whether there is a next sense point in the die. If the decision step is true, step 701 is repeated. If the decision step is false, step 704 selects the sense point with the lowest voltage among the sense points in the die, and stores data identifying the sense point having the lowest sensed voltage cross-referenced to the workflow identifier. For example, see FIG. 7D.

A decision step 705 determines whether there is a next workflow. If the decision step is true, step 700 is reached. If the decision step 705 is false, the process is done at step 706.

In one approach, the process chooses an optimal sense point for each workflow of a plurality of different workflows. In another approach, the process chooses an optimal sense point for a plurality of different workflows, such as by choosing one of the sense points which most often has the lowest voltage. The sense point with the lowest voltage is selected as it is typically desired to ensure that the supplied power to the circuits of a die is above a specified minimum. By providing the lowest sense voltage as a feedback signal to the VR, the VR will adjust its output accordingly.

In one alternative to the process of FIG. 7A, the sense point having the lowest sensed voltage is not stored cross-referenced to a workflow identifier. Instead, the process involves periodically checking to see which sense point has the lowest voltage, then selecting that sense point for output as Vsense-D. The process can thus periodically re-evaluate which sense point is optimal.

Figure 7B:
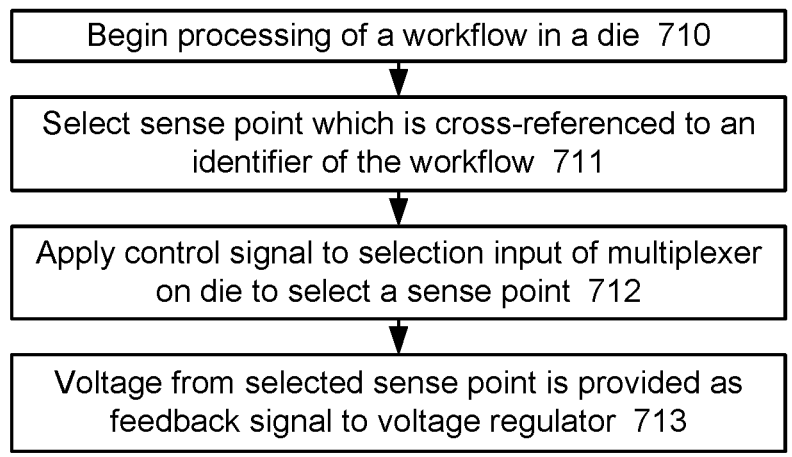
FIG. 7B depicts a flowchart of an example process for using an optimal sense point in a die based on a workflow in an operational phase of the die, according to various embodiments.

FIG. 7B depicts a flowchart of an example process for using an optimal sense point in a die based on a workflow in an operational phase of the die, according to various embodiments. The process can be performed each time a new workflow is received at a die, for example. The process assumes that information on the optimal sense point for a given workflow was obtained from a process such as in FIG. 7A. Note that it is also possible to select an optimal sense point for a given workflow based on a priori knowledge of the power consumption of the circuits of the die. The operational phase can refer to the normal use of the die by the end user over the lifetime of the die.

Step 710 begins processing of a workflow in a die. Step 711 includes selecting a sense point which is cross-referenced to an identifier of the workflow. See FIG. 7D, for example. Step 712 includes applying a control signal to the selection input of a multiplexer on the die to select a sense point. Subsequently, at step 713, the voltage from selected sense point is provided as feedback signal to the voltage regulator.

FIG. 7C depicts an example data structure consistent with step 702 of the process of FIG. 7A, according to various embodiments. The data structure can be a table, for example. The first three entries are for a workload with an identifier WL1, and indicate sense points and corresponding sensed voltages, e.g., SP1, SP2, SP3 and V1-WL1, V2-WL1 and V3-WL1, respectively. In this example, the second entry is selected assuming V2-WL1 is less than V1-WL1 and V3-WL1.

The next three entries are for a workload with an identifier WL2, and indicate sense points and corresponding sensed voltages, e.g., SP1, SP2, SP3 and V1-WL2, V2-WL2 and V3-WL2, respectively. In this example, the third entry is selected assuming V3-WL2 is less than V1-WL2 and V2-WL2. Two workloads are depicted as a simplified example as many more could be used.

As an example, SP1, SP2 and SP3 could be the sense points 570, 571 and 572, respectively, of FIG. 5C. If SP2 has the lowest voltage of this group during WL1, this may indicate the circuit 561 performs all or most of the tasks associated with WL1 and therefore provides the largest load in the die. If SP3 has the lowest voltage of this group during WL2, this may indicate the circuit 562 performs all or most of the tasks associated with WL2 and therefore provides the largest load in the die.

FIG. 7D depicts an example data structure consistent with step 704 of the process of FIG. 7B, and with FIG. 7C, according to various embodiments. The first column depicts a workload identifier and the second column depicts the optimal sense point. As mentioned, SP2 is the optimal sense point for WL1, and SP3 is the optimal sense point for WL2.

FIG. 7E depicts a flowchart of an example process for analyzing digitized voltages from a die before providing a digital signal which represents the digitized voltages to a voltage regulator as a feedback signal, consistent with the circuit 250 of FIG. 2B, according to various embodiments. The process may be performed by the buffer 203 and P unit 113, for example, in an operational mode of the die. Step 720 includes receiving digitized voltages from a die. Step 721 includes storing the digitized voltages in the buffer. Step 722 includes performing an analysis on the digitized voltages. Step 723 includes, based on the analysis, providing a digital signal which represents the digitized voltages to the voltage regulator as a feedback signal.

Figure 8:
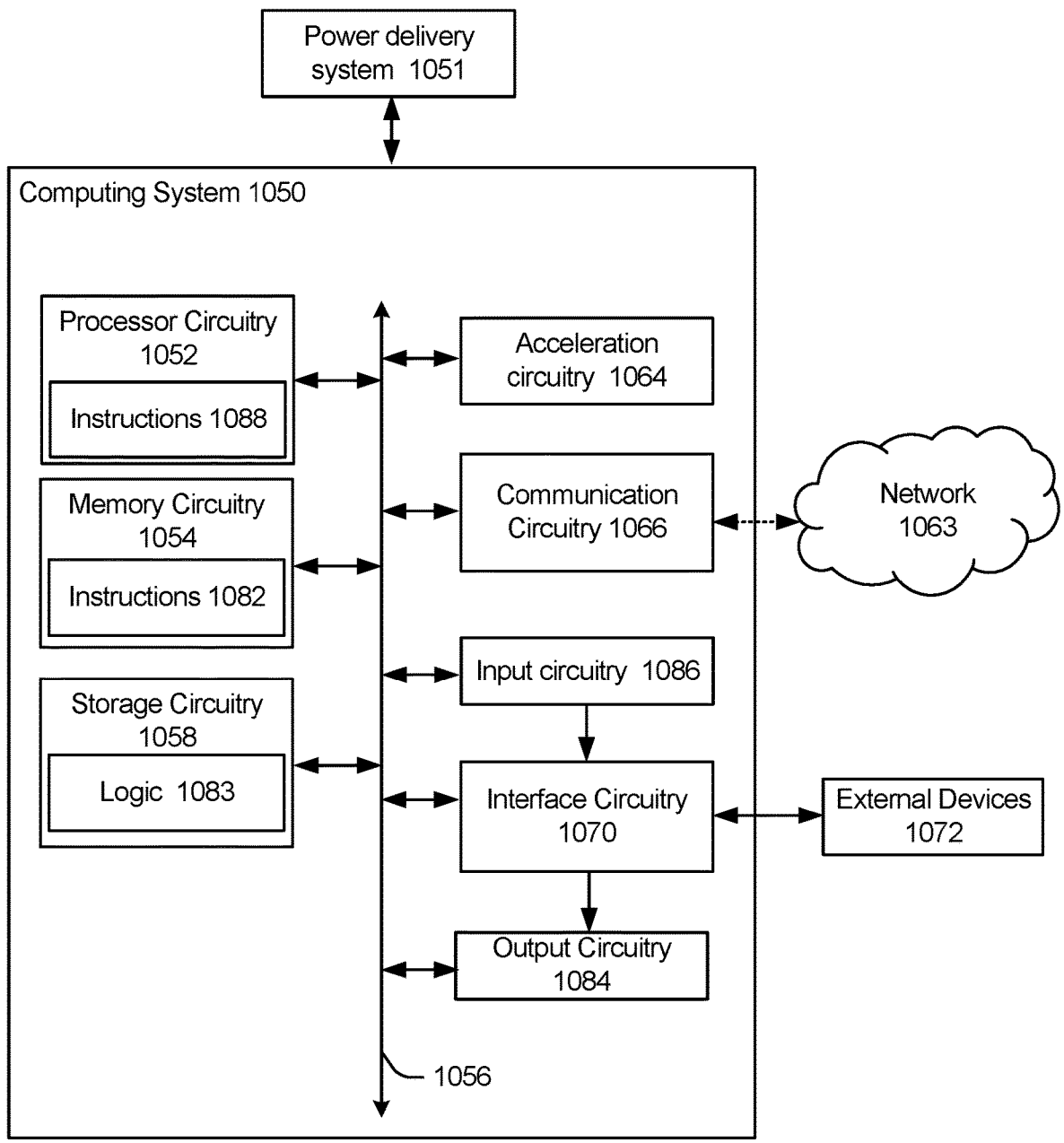
FIG. 8 illustrates an example of components that may be present in a computing system 1050 for implementing the techniques (e.g., operations, processes, methods, and methodologies) described herein, according to various embodiments.

FIG. 8 illustrates an example of components that may be present in a computing system 1050 for implementing the techniques (e.g., operations, processes, methods, and methodologies) described herein. The voltage regulators of FIG. 2A-5C can be located in a power delivery system 1051 which provides power to one or more other components of the computing system. The SoC of FIG. 2A-5C can be located in any of the circuitry 1052, 1054, 1058, 1064, 1066, 1070 and 1084, for example.

The computing system 1050 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1050, or as components otherwise incorporated within a chassis of a larger system. For one embodiment, at least one processor 1052 may be packaged together with computational logic 1082 and configured to practice aspects of various example embodiments described herein to form a System in Package (SiP) or a System on Chip (SoC).

The system 1050 includes processor circuitry in the form of one or more processors 1052. The processor circuitry 1052 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1052 may include one or more hardware accelerators (e.g., same or similar to acceleration circuitry 1064), which may be microprocessors, programmable processing devices (e.g., FPGA, ASIC, etc.), or the like. The one or more accelerators may include, for example, computer vision and/or deep learning accelerators. In some implementations, the processor circuitry 1052 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1052 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1052 may be coupled with or may include memory/storage and may be configured to execute instructions stored in the memory/storage to enable various applications or operating systems to run on the platform 1050. The processors (or cores) 1052 is configured to operate application software to provide a specific service to a user of the platform 1050. In some embodiments, the processor(s) 1052 may be a special-purpose processor(s)/controller(s) configured (or configurable) to operate according to the various embodiments herein.

As examples, the processor(s) 1052 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MXGPUs, Epyc® processor(s), or the like; A5-A12 and/or S1-S4 processor(s) from Apple® Inc., Snapdragon™ or Centriq™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1052 may be a part of a system on a chip (SoC), System-in-Package (SiP), a multi-chip package (MCP), and/or the like, in which the processor(s) 1052 and other components are formed into a single integrated circuit, or a single package, such as the Edison™ or Galileo™ SoC boards from Intel® Corporation. Other examples of the processor(s) 1052 are mentioned elsewhere in the present disclosure.

The system 1050 may include or be coupled to acceleration circuitry 1064, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1064 may comprise logic blocks or logic fabric and other interconnected resources that may be programmed (configured) to perform various functions, such as the procedures, methods, functions, etc. of the various embodiments discussed herein. In such implementations, the acceleration circuitry 1064 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1052 and/or acceleration circuitry 1064 may include hardware elements specifically tailored for machine learning and/or artificial intelligence (AI) functionality. In these implementations, the processor circuitry 1052 and/or acceleration circuitry 1064 may be, or may include, an AI engine chip that can run many different kinds of AI instruction sets once loaded with the appropriate weightings and training code. Additionally or alternatively, the processor circuitry 1052 and/or acceleration circuitry 1064 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPS™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1052 and/or acceleration circuitry 1064 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1050 may be operated by the respective AI accelerating co-processor(s), AI GPUs, TPUs, or hardware accelerators (e.g., FPGAS, ASICs, DSPs, SoCs, etc.), etc., that are configured with appropriate logic blocks, bit stream(s), etc. to perform their respective functions.

The system 1050 also includes system memory 1054. Any number of memory devices may be used to provide for a given amount of system memory. As examples, the memory 1054 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 1054 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1054 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1058 provides persistent storage of information such as data, applications, operating systems and so forth. In an example, the storage 1058 may be implemented via a solid-state disk drive (SSDD) and/or high-speed electrically erasable memory (commonly referred to as "flash memory"). Other devices that may be used for the storage 1058 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1054 and/or storage circuitry 1058 may also incorporate three-dimensional (3D) cross-point (XPOINT) memories from Intel® and Micron®.

The memory circuitry 1054 and/or storage circuitry 1058 is/are configured to store computational logic 1083 in the form of software, firmware, microcode, or hardware-level instructions to implement the techniques described herein. The computational logic 1083 may be employed to store working copies and/or permanent copies of programming instructions, or data to create the programming instructions, for the operation of various components of system 1050 (e.g., drivers, libraries, application programming interfaces (APIs), etc.), an operating system of system 1050, one or more applications, and/or for carrying out the embodiments discussed herein. The computational logic 1083 may be stored or loaded into memory circuitry 1054 as instructions 1082, or data to create the instructions 1082, which are then accessed for execution by the processor circuitry 1052 to carry out the functions described herein. The processor circuitry 1052 and/or the acceleration circuitry 1064 accesses the memory circuitry 1054 and/or the storage circuitry 1058 over the interconnect (IX) 1056. The instructions 1082 direct the processor circuitry 1052 to perform a specific sequence or flow of actions, for example, as described with respect to flowchart(s) and block diagram(s) of operations and functionality depicted previously. The various elements may be implemented by assembler instructions supported by processor circuitry 1052 or high-level languages that may be compiled into instructions 1088, or data to create the instructions 1088, to be executed by the processor circuitry 1052. The permanent copy of the programming instructions may be placed into persistent storage devices of storage circuitry 1058 in the factory or in the field through, for example, a distribution medium (not shown), through a communication interface (e.g., from a distribution server (not shown)), over-the-air (OTA), or any combination thereof.

The IX 1056 couples the processor 1052 to communication circuitry 1066 for communications with other devices, such as a remote server (not shown) and the like. The communication circuitry 1066 is a hardware element, or collection of hardware elements, used to communicate over one or more networks 1063 and/or with other devices. In one example, communication circuitry 1066 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1066 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1056 also couples the processor 1052 to interface circuitry 1070 that is used to connect system 1050 with one or more external devices 1072. The external devices 1072 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1050, which are referred to as input circuitry 1086 and output circuitry 1084. The input circuitry 1086 and output circuitry 1084 include one or more user interfaces designed to enable user interaction with the platform 1050 and/or peripheral component interfaces designed to enable peripheral component interaction with the platform 1050. Input circuitry 1086 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1084 may be included to show information or otherwise convey information, such as sensor readings, actuator position(s), or other like information. Data and/or graphics may be displayed on one or more user interface components of the output circuitry 1084. Output circuitry 1084 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1050. The output circuitry 1084 may also include speakers and/or other audio emitting devices, printer(s), and/or the like. Additionally or alternatively, sensor(s) may be used as the input circuitry 1084 (e.g., an image capture device, motion capture device, or the like) and one or more actuators may be used as the output device circuitry 1084 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1050 may communicate over the IX 1056. The IX 1056 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1056 may be a proprietary bus, for example, used in a SoC based system.

The number, capability, and/or capacity of the elements of system 1050 may vary, depending on whether computing system 1050 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1050 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a die comprising a power distribution network which is to receive power from a voltage regulator external to the die; and one or more analog-to-digital converters (ADCs) on the die coupled to the power distribution network, wherein the one or more ADCs are to digitize voltages of one or more sense points in the power distribution network for output from the die.

Example 2 includes the apparatus of Example 1, wherein: the one or more ADCs comprise a plurality of ADCs which are to digitize voltages of a plurality of sense points in the power distribution network; the apparatus further comprises a multiplexer on the die coupled to the plurality of ADCs; the multiplexer is to receive an output from each of the ADCs representing respective digitized voltages of each ADC; and the die is to receive an external control signal for a selection input of the multiplexer.

Example 3 includes the apparatus of Example 2, further comprising a base layer on which the die is mounted by a plurality of bumps, wherein at least a first bump of the plurality of bumps is coupled to the power distribution network and is to receive the power from the voltage regulator, and at least a second bump of the plurality of bumps is coupled to an output of the multiplexer.

Example 4 includes the apparatus of Example 3, wherein at least a third bump of the plurality of bumps is coupled to a selection input of the multiplexer and to a control unit external to the die to receive a control signal to control the multiplexer.

Example 5 includes the apparatus of any one of Examples 2-4, wherein the control signal is based on a workload of the die and is to change as the workload of the die changes.

Example 6 includes the apparatus of any one of Examples 2-5, wherein the control signal is to select one of the sense points having a lowest sensed voltage among the plurality of sense points.

Example 7 includes the apparatus of any one of Examples 1-6, further comprising a base layer on which the die is mounted by a plurality of bumps, wherein at least a first bump of the plurality of bumps is coupled to the power distribution network and is to receive the power from the voltage regulator, and at least a second bump of the plurality of bumps is to output digitized voltages of the one or more ADCs to the voltage regulator.

Example 8 includes the apparatus of Example 7, wherein the at least the second bump is to output the digitized voltages of the one or more ADCs to a control unit external to the die, and the control unit is to provide a voltage set point to the voltage regulator based on the digitized voltages.

Example 9 includes the apparatus of any one of Examples 1-8, wherein: the die is in a set of dies on a package; and each die is to receive power from the voltage regulator.

Example 10 includes the apparatus of Example 9, further comprising: a multiplexer external to the set of dies to receive a digitized voltage from each die of the set of dies; wherein the multiplexer is to receive a control signal for a selection input of the multiplexer.

Example 11 includes an apparatus, comprising: a control unit; a buffer coupled to the control unit; and a die coupled to the buffer and to a voltage regulator, wherein the die is to output digitized voltages from one or more sense points in the die to the buffer, and the control unit is to perform an analysis of the digitized voltages and, based on the analysis, provide a digital signal which represents the digitized voltages to the voltage regulator as a feedback signal of the voltage regulator.

Example 12 includes the apparatus of Example 11, wherein the digital signal represents a moving average of the digitized voltages.

Example 13 includes the apparatus of Example 11 or 12, wherein the control unit is to provide the digital signal which represents the digitized voltages to a pulse width modulator of the voltage regulator to modulate a voltage provided by the voltage regulator to the die.

Example 14 includes the apparatus of any one of Examples 11-13, wherein the control unit is to provide a voltage set point to the voltage regulator based on the digital signal which represents the digitized voltages.

Example 15 includes an apparatus, comprising: a memory to store instructions; and a processor to execute the instructions to receive digitized voltages from a multiplexer in a die, wherein the digitized voltages represent voltages of different sense points of a power distribution network in the die, and based on the digitized voltages, provide a control signal to a selection input of the multiplexer.

Example 16 includes the apparatus of Example 15, wherein the control signal is to select each sense point in turn to obtain the digitized voltages which represent the voltages of the different sense points, and the processor is to execute the instructions to perform an evaluation of the digitized voltages to select one of the sense points having a lowest sensed voltage among the different sense points.

Example 17 includes the apparatus of Example 16, wherein the processor is to execute the instructions to provide a voltage set point to a voltage regulator based on the evaluation, and the voltage regulator is coupled to the power distribution network.

Example 18 includes the apparatus of Example 16 or 17, wherein the processor is to execute the instructions to store data identifying the one of the sense points having the lowest sensed voltage cross-referenced to an identifier of a current workflow of the die.

Example 19 includes an apparatus, comprising: a control unit; and a die coupled to the control unit, wherein: the die is to be powered by a voltage regulator; the control unit is to receive information identifying a current workload of the die and, in response to the information, provide a control signal to a selection input of a multiplexer in the die; the multiplexer is to receive voltages from different sense points in the die; and an output of the multiplexer is coupled to a feedback path of the voltage regulator.

Example 20 includes the apparatus of Example 19, wherein the control unit is to change the control signal as the current workload of the die changes.

Example 21 includes the apparatus of Example 19 or 20, wherein the control signal is to select one of the sense points having a lowest sensed voltage among the different sense points.

In the present detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a die comprising a power distribution network which is to receive power from a voltage regulator external to the die;
one or more analog-to-digital converters (ADCs) on the die coupled to the power distribution network, wherein the one or more ADCs are to digitize voltages of one or more sense points in the power distribution network for output from the die; and
a base layer on which the die is mounted by a plurality of bumps, wherein at least a first bump of the plurality of bumps is coupled to the power distribution network and is to receive the power from the voltage regulator, and at least a second bump of the plurality of bumps is to provide digitized voltages of the one or more ADCs to the voltage regulator.

2. The apparatus of claim 1, wherein:
the one or more ADCs comprise a plurality of ADCs which are to digitize voltages of a plurality of sense points in the power distribution network;
the apparatus further comprises a multiplexer on the die coupled to the plurality of ADCs;

the multiplexer is to receive an output from each of the ADCs representing respective digitized voltages of each ADC; and the die is to receive an external control signal for a selection input of the multiplexer.

3. The apparatus of claim 2, wherein at least a third bump of the plurality of bumps is coupled to a selection input of the multiplexer and to a control unit external to the die to receive a control signal to control the multiplexer.

4. The apparatus of claim 2, wherein the control signal is based on a workload of the die and is to change as the workload of the die changes.

5. The apparatus of claim 2, wherein the control signal is to select one of the sense points having a lowest sensed voltage among the plurality of sense points.

6. The apparatus of claim 1, wherein the at least the second bump is to output the digitized voltages of the one or more ADCs to a control unit external to the die, and the control unit is to provide a voltage set point to the voltage regulator based on the digitized voltages.

7. The apparatus of claim 1, wherein:
the die is in a set of dies on a package; and
each die is to receive power from the voltage regulator.

8. The apparatus of claim 7, further comprising:
a multiplexer external to the set of dies to receive a digitized voltage from each die of the set of dies;
wherein the multiplexer is to receive a control signal for a selection input of the multiplexer.

9. An apparatus, comprising:
a control unit;
a buffer coupled to the control unit; and
a die coupled to the buffer and to a voltage regulator, wherein the die is to provide digitized voltages from one or more sense points in the die to the buffer, and the control unit is to perform an analysis of the digitized voltages and, based on the analysis, provide a digital signal which represents the digitized voltages to the voltage regulator as a feedback signal of the voltage regulator.

10. The apparatus of claim 9, wherein the digital signal represents a moving average of the digitized voltages.

11. The apparatus of claim 9, wherein the control unit is to provide the digital signal which represents the digitized voltages to a pulse width modulator of the voltage regulator to modulate a voltage provided by the voltage regulator to the die.

12. The apparatus of claim 9, wherein the control unit is to provide a voltage set point to the voltage regulator based on the digital signal which represents the digitized voltages.

13. An apparatus, comprising:
a memory to store instructions; and
a processor to execute the instructions to receive digitized voltages from a multiplexer in a die, wherein the digitized voltages represent voltages of different sense points of a power distribution network in the die, and based on the digitized voltages, provide a control signal to a selection input of the multiplexer.

14. The apparatus of claim 13, wherein the control signal is to select each sense point in turn to obtain the digitized voltages which represent the voltages of the different sense points, and the processor is to execute the instructions to perform an evaluation of the digitized voltages to select one of the sense points having a lowest sensed voltage among the different sense points.

15. The apparatus of claim 14, wherein the processor is to execute the instructions to provide a voltage set point to a voltage regulator based on the evaluation, and the voltage regulator is coupled to the power distribution network.

16. The apparatus of claim 14, wherein the processor is to execute the instructions to store data identifying the one of the sense points having the lowest sensed voltage cross-referenced to an identifier of a current workflow of the die.

17. An apparatus, comprising:
a control unit; and
a die coupled to the control unit, wherein:
the die is to be powered by a voltage regulator;
the control unit is to receive information identifying a current workload of the die and, in response to the information, provide a control signal to a selection input of a multiplexer in the die;
the multiplexer is to receive voltages from different sense points in the die; and
an output of the multiplexer is coupled to a feedback path of the voltage regulator.

18. The apparatus of claim 17, wherein the control unit is to change the control signal as the current workload of the die changes.

19. The apparatus of claim 17, wherein the control signal is to select one of the sense points having a lowest sensed voltage among the different sense points.

* * * * *